United States Patent
Chang et al.

(10) Patent No.: US 10,566,780 B2
(45) Date of Patent: Feb. 18, 2020

(54) ELECTRONIC CIRCUIT FOR SINGLE-EVENT LATCH-UP DETECTION AND PROTECTION

(71) Applicant: NANYANG TECHNOLOGICAL UNIVERSITY, Singapore (SG)

(72) Inventors: Joseph Sylvester Chang, Singapore (SG); Wei Shu, Singapore (SG); Jize Jiang, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 330 days.

(21) Appl. No.: 15/518,762

(22) PCT Filed: Nov. 17, 2015

(86) PCT No.: PCT/SG2015/050452
§ 371 (c)(1),
(2) Date: Apr. 12, 2017

(87) PCT Pub. No.: WO2016/080909
PCT Pub. Date: May 26, 2016

(65) Prior Publication Data
US 2017/0237250 A1     Aug. 17, 2017

(30) Foreign Application Priority Data
Nov. 19, 2014    (SG) .......................... 10201407871P (51) Int. Cl.
*H02H 3/10* (2006.01)
*H02H 3/44* (2006.01)
(Continued)

(52) U.S. Cl.
CPC .......... *H02H 3/10* (2013.01); *H01L 27/0248* (2013.01); *H02H 1/0007* (2013.01); *H02H 3/08* (2013.01); *H02H 3/44* (2013.01)

(58) Field of Classification Search
CPC .. H02H 3/08; H02H 3/10; H02H 3/44; H02H 1/0007; H01H 3/44; H01L 27/0248
(Continued)

(56) References Cited

U.S. PATENT DOCUMENTS

| 4,733,321 | A | 3/1988 | Lindeperg |
| 6,064,555 | A | 5/2000 | Czajkowski et al. |

(Continued)

FOREIGN PATENT DOCUMENTS

WO    2016080909 A1    5/2016

OTHER PUBLICATIONS

Foreign Communication From a Related Counterpart Application, International Search Report and Written Opinion dated Jan. 11, 2016, International Application No. PCT/SG2015/050452 filed on Nov. 17, 2015.

*Primary Examiner* — Dharti H Patel (57) ABSTRACT

An electronic circuit for single-event latch-up (SEL) detection and protection of a target integrated circuit (IC) is disclosed. The circuit comprises: a first detector configured for detecting an absolute load current (i) and comparing the absolute load current (i) with a threshold current ($i_{th}$); a second detector configured for detecting a rate of change of load current (di/dt) and comparing the rate of change of load current (di/dt) with a threshold current change rate $(di/dt)_{th}$; and a determination module for triggering a power shutdown to the target IC if the absolute load current (i) exceeds the threshold current ($i_{th}$) and/or the rate of change of load current (di/dt) exceeds the threshold current change rate $(di/dt)_{th}$.

16 Claims, 4 Drawing Sheets

(51) Int. Cl.
 *H01L 27/02* (2006.01)
 *H02H 3/08* (2006.01)
 *H02H 1/00* (2006.01)

(58) Field of Classification Search
 USPC .......................................................... 361/87
 See application file for complete search history.

(56) References Cited

U.S. PATENT DOCUMENTS

| | | | |
|---|---|---|---|
| 6,426,612 B1* | 7/2002 | Rozsypal | H02M 3/1588 |
| | | | 323/282 |
| 2008/0285192 A1 | 11/2008 | Phadke et al. | |
| 2012/0056637 A1 | 3/2012 | Jeong et al. | |
| 2014/0118001 A1* | 5/2014 | Bang | H02H 3/44 |
| | | | 324/537 |
| 2014/0268461 A1* | 9/2014 | Jeong | H02H 3/08 |
| | | | 361/87 |

* cited by examiner

ELECTRONIC CIRCUIT FOR SINGLE-EVENT LATCH-UP DETECTION AND PROTECTION

CROSS-REFERENCE TO RELATED APPLICATIONS

The present application is a filing under 35 U.S.C. 371 as the National Stage of International Application No. PCT/SG2015/050452, filed Nov. 17, 2015, entitled "ELECTRONIC CIRCUIT FOR SINGLE-EVENT LATCH-UP DETECTION AND PROTECTION," which claims priority to Singapore Application No. SG 10201407871P filed with the Intellectual Property Office of Singapore on Nov. 19, 2014 and entitled "ELECTRONIC CIRCUIT FOR SINGLE-EVENT LATCH-UP DETECTION AND PROTECTION," both of which are incorporated herein by reference in their entirety for all purposes.

FIELD OF THE INVENTION

The present invention relates to an electronic circuit for single-event latch-up (SEL) detection and protection. Particularly, but not exclusively, the invention relates to such a circuit that is suitable for use in space applications.

BACKGROUND

There is great interest and demand to adopt Complementary Metal-Oxide Semiconductor (CMOS) Commercial-Off-The-Shelf (COTS) Integrated Circuits (ICs) instead of space-grade ICs in space applications, largely due to their higher performance (including functionalities), lower cost and availability. It is also well-known that COTS ICs are subjective to various radiation effects including the accumulative effect of Total Ionizing Dose (TID) and a number of single-event effects such as those described as Single Event Transient (SET), Single Event Upset (SEU) and Single Event Latch-up (SEL), etc. Amongst said radiation effects, SEL is the most devastating because, unlike other effects that largely introduce errors or degrade performance, SEL may permanently destroy COTS ICs.

SEL occurs when a parasitic Silicon Controlled Rectifier structure in a CMOS IC is activated by energetic particles such as heavy ions, protons or neutrons, and this induces a huge current. The consequences of SEL include soft failures such as loss of data or logic state, and destructive hard failures if ICs are subject to SEL current for an excessive period of time.

Figure 1:
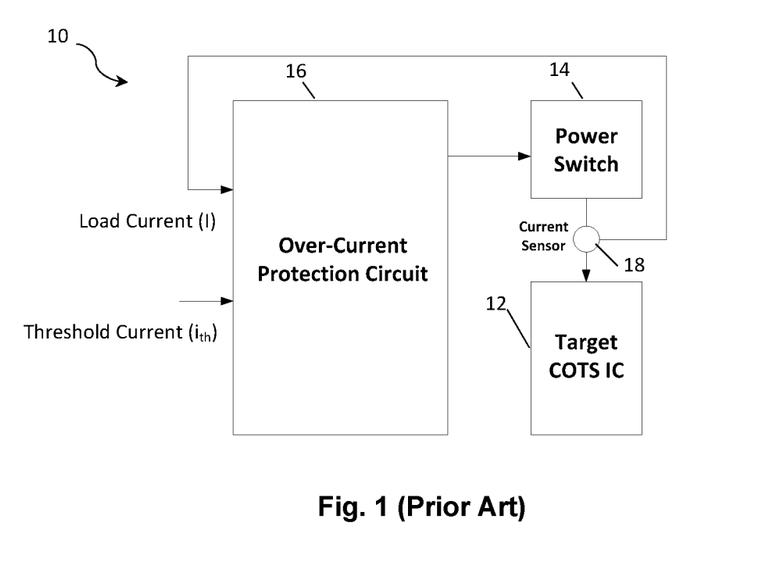
FIG. 1 is a schematic diagram of a conventional SEL detection and protection circuit, as explained above.

In view of this, there is a real need for an SEL detection and protection circuit for COTS ICs in space applications. FIG. 1 depicts a block diagram of a conventional SEL detection and protection circuit 10. The SEL detection and protection circuit 10 serves to shut down (i.e. disable the power to) a target COTS IC 12 when SEL occurs, and restarts (i.e. reconnects) a power supply via a power switch 14 to the target IC 12 when the SEL effect is removed.

In the conventional approach, the SEL detection and protection circuit 10 is realised by an over-current protection circuit 16 as depicted in FIG. 1. The over-current protection circuit 16 senses the load current I of the target IC 12 via a current sensor 18 and compares it against a pre-determined threshold current $i_{th}$. When SEL happens, the load current I exceeds the threshold current $i_{th}$, and the over-current protection circuit 16 is triggered to shut down the target IC 12 by means of disconnecting the power via switch 14.

Although the conventional SEL protection approach can theoretically protect target ICs from large SEL currents, there are some shortcomings in practical space applications. Firstly, it is very challenging to determine an appropriate threshold current. Specifically, the load current of target ICs can be in a large range, depending on the specific ICs, and the load current may further deviate substantially from its nominal range due to radiation effects, temperature variations, aging, etc. Hence, to avoid false triggering, the threshold current is usually set much higher than the nominal current (e.g. 4-5 times), and consequently, the target ICs may inadvertently be subjected to a large SEL current for an extended period before the protection is triggered. Secondly, it is well-known that micro latch-up may occur in some COTS ICs (depending on the fabrication process, layout, etc.). The conventional approach, that requires a high threshold current, may not be effective to detect such micro latch-up that usually dissipates at a localised low current. Nevertheless, micro latch-up may result in localised damage. In short, the conventional approach to SEL detection and protection is inadequate.

It is therefore an aim of the present invention to provide an improved electronic circuit for single-event latch-up (SEL) detection and protection that is particularly well suited to space applications.

SUMMARY OF THE INVENTION

In accordance with a first aspect of the invention there is provided an electronic circuit for single-event latch-up (SEL) detection and protection of a target integrated circuit (IC) comprising:
a) a first detector configured for detecting an absolute load current (i) and comparing the absolute load current (i) with a threshold current ($i_{th}$);
b) a second detector configured for detecting a rate of change of load current (di/dt) and comparing the rate of change of load current (di/dt) with a threshold current change rate $(di/dt)_{th}$; and
c) a determination module for triggering a power shut-down to the target IC if the absolute load current (i) exceeds the threshold current ($i_{th}$) and/or the rate of change of load current (di/dt) exceeds the threshold current change rate $(di/dt)_{th}$.

Thus, embodiments of present invention provide an electronic circuit for SEL latch-up detection and protection that detects both an absolute load current (i) and a rate of change of load current (di/dt) and compares them with a threshold current ($i_{th}$) and a threshold current change rate $(di/dt)_{th}$, respectively, so that a shut-down of power to the target IC is triggered if either one or both of these values exceed the respective threshold value. Accordingly, embodiments of the invention make use of both the load current and the rate of change of the load current to ensure that a SEL event is detected as early as possible so that the power to the target IC can be disabled as quickly as possible. Such a system is clearly advantageous over the prior art which relies solely on detecting when load current exceeds a threshold current.

An advantage of triggering a shut-down when the rate of change of load current (di/dt) exceeds the threshold current change rate $(di/dt)_{th}$ is that it allows for an SEL event to be detected sooner than it would otherwise be (e.g. when based on absolute load current values alone). This is because a SEL event is likely to result in a rapid increase in the current change rate even before an absolute load current threshold is reached.

The absolute load current (i) may be detected by measuring the voltage (V) across a resistor $R_{sense}$ and dividing V by $R_{sense}$. A voltage amplifier may be provided for use in detecting the absolute load current (i). In another embodiment, the load current (i) may be detected by charging a capacitor of capacitance C and using the equation $i(t)=C \times dV/dt$ to determine the current (i) at time (t) by the voltage V developed across the capacitor.

In some embodiments, the rate of change of load current (di/dt) may be detected using an analog differentiator.

It will be understood that advantages of embodiments of the present invention are achieved through the sensing of the rate of change of the current to more quickly detect SEL. The most common means of ascertaining the rate of change of the current is via an analog differentiator (e.g. by an operational amplifier configured to be a differentiator). However, other means could be employed, including current mode means such as through a current conveyor circuit. In another embodiment, the current signal (e.g. measured as a voltage across a resistor) could be converted into a digital signal and the differentiation computed digitally.

The first detector may comprise a first comparator for comparing the absolute load current (i) with the threshold current ($i_{th}$).

The second detector may comprise a second comparator for comparing the rate of change of load current (di/dt) with the threshold current change rate $(di/dt)_{th}$.

The second comparator may comprise a first module for comparing the absolute load current (i) with a first load current value ($i_{th1}$) and a second module for comparing the absolute load current (i) with a second load current value ($i_{th2}$), where $i_{th2} > i_{th1}$ (and $i_{th2} - i_{th1} = di$) and wherein a time interval (dt) is measured between when the absolute load current (i) exceeds $i_{th1}$ to when the absolute load current (i) exceeds $i_{th2}$ so as to determine the rate of change of load current (di/dt).

The threshold current change rate $(di/dt)_{th}$ may be set such that $di_{th} = i_{th2} - i_{th1}$ and $dt_{th} =$ a typical time interval for the load current (i) to increase from $i_{th1}$ to $i_{th2}$ due to a SEL event. Accordingly, if the measured time interval (dt) is within the pre-determined threshold time interval $(dt_{th})$ it may be determined that a SEL event has occurred and the power shut-down will be triggered.

The threshold current $i_{th}$ may be significantly greater than $i_{th2}$. For example, $i_{th}$ may be 10, 20, 30, 50 or 100 times greater than $i_{th2}$.

A filter (e.g. a Low-Pass Filter, LPF or a High-Pass Filter, HPF) may be employed to filter out false trigger signals that may be caused by normal transient current.

The determination module may comprise one or more logic gate and may be synchronous or asynchronous.

The threshold current ($i_{th}$) and/or the threshold current change rate $(di/dt)_{th}$ may be provided via a threshold determination unit. The threshold determination unit may be pre-programmed with values for the threshold current ($i_{th}$) and/or the threshold current change rate $(di/dt)_{th}$. In some embodiments, the threshold determination unit may calculate values for the threshold current ($i_{th}$) and/or the threshold current change rate $(di/dt)_{th}$. For example, the threshold determination unit may monitor the actual load current (and/or rate of change of the load current) to determine a range indicative of normal circuit behavior. The threshold values may then be determined taking into account the indicative range and, in particular, an expected maximum value for the normal operating range. For example, the threshold values may be set within or as a range of, for example, 1.5 to 2 times, 2 to 3 times, 3 to 4 times or 4 to 5 times the expected maximum values. In this way, the threshold values will be set so as to distinguish normal transient current values from a current resulting from SEL.

The target integrated circuit (IC) may be a Commercial-Off-The-Shelf (COTS) IC. It should be understood that the threshold values will largely be determined by the characteristics of the COTS IC (i.e. the system load).

In some embodiments, the target integrated circuit (IC) may be configured for a space application.

The determination module may trigger a power cycling stage to shut-down the target IC and subsequently resume power to the target IC after a pre-determined duration (i.e. a power cycling time). The pre-determined duration may be calculated to ensure SEL effects are completely eradicated. The power cycling time may be determined empirically. However, in some embodiments, a power cycling time of several milliseconds will typically be sufficient to remove the SEL effect.

In accordance with a second aspect of the invention there is provided an electronic device comprising an electronic circuit for single-event latch-up (SEL) detection and protection in accordance with the first aspect of the invention and a target integrated circuit (IC).

In accordance with a third aspect of the invention there is provided a method of single-event latch-up (SEL) detection and protection for a target integrated circuit (IC) comprising:
  a) detecting an absolute load current (i);
  b) comparing the absolute load current (i) with a threshold current ($i_{th}$);
  c) detecting a rate of change of load current (di/dt);
  d) comparing the rate of change of load current (di/dt) with a threshold current change rate $(di/dt)_{th}$; and
  e) triggering a power shut-down to the target IC if the absolute load current (i) exceeds the threshold current ($i_{th}$) and/or the rate of change of load current (di/dt) exceeds the threshold current change rate $(di/dt)_{th}$.

BRIEF DESCRIPTION OF THE DRAWINGS

Embodiments of the invention will now be described, by way of example only, with reference to the following drawings, in which.

DETAILED DESCRIPTION

Figure 2:
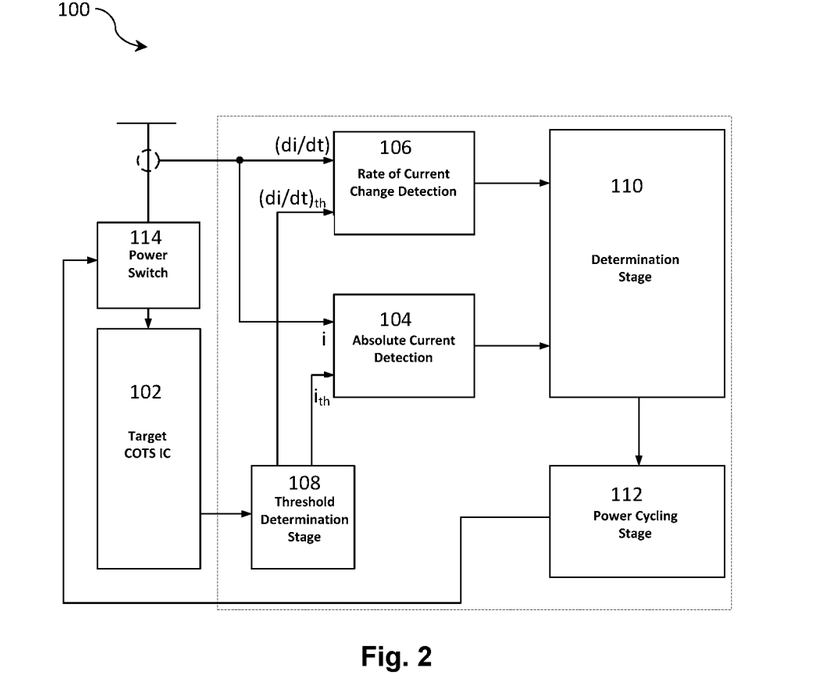
FIG. 2 is a block diagram of a generic implementation of an SEL detection and protection circuit in accordance with a first embodiment of the invention.

In accordance with a first embodiment of the present invention there is provided an electronic circuit 100 for single-event latch-up (SEL) detection and protection as shown in FIG. 2. The circuit 100 comprises a target COTS IC 102 coupled to a first detector 104 for detecting the absolute load current (i) of the IC 102 and a second detector 106 for detecting the rate of change of load current (di/dt) for the IC 102. Together, the first and second detectors 104, 106 can be considered to constitute a detection stage as will be explained in more detail below.

A threshold determination unit 108 is provided between the IC 102 and each of the first detector 104 and second detector 106 for providing a threshold current ($i_{th}$) and threshold current change rate $(di/dt)_{th}$. In this embodiment, the threshold current ($i_{th}$) and threshold current change rate $(di/dt)_{th}$ are pre-programmed into the threshold determination unit 108. However, in other embodiments the threshold values may be determined by monitoring the actual load current and rate of change of the load current to determine a range indicative of normal circuit behavior, extracting from the range an expected maximum value for the normal operating range and setting the threshold values well above the expected maximum values (e.g. 1.5, 2, 3, 4 or 5 times the expected maximum values).

Although not shown in FIG. 2, each of the first and second detectors 104, 106 comprise a comparator for comparing the absolute load current (i) with a threshold current ($i_{th}$); and the rate of change of load current (di/dt) with a threshold current change rate $(di/dt)_{th}$, respectively.

Output signals from each of the first and second detectors 104, 106 are input to a determination stage (i.e. module) 110. The determination stage 110 is configured to trigger a power shut-down to the IC 102 if the absolute load current (i) exceeds the threshold current ($i_{th}$) and/or the rate of change of load current (di/dt) exceeds the threshold current change rate $(di/dt)_{th}$. In the embodiment shown in FIG. 2, the determination stage 110 is coupled to a power cycling stage 112 which is configured to receive a signal from the determination stage 110 and shut-down the IC 102 via power switch 114 and to subsequently resume power to the IC 102 (by reconnecting power switch 114) after a pre-determined duration. The pre-determined duration is established so as to provide sufficient time for the effects of SEL to be eradicated.

Figure 3:
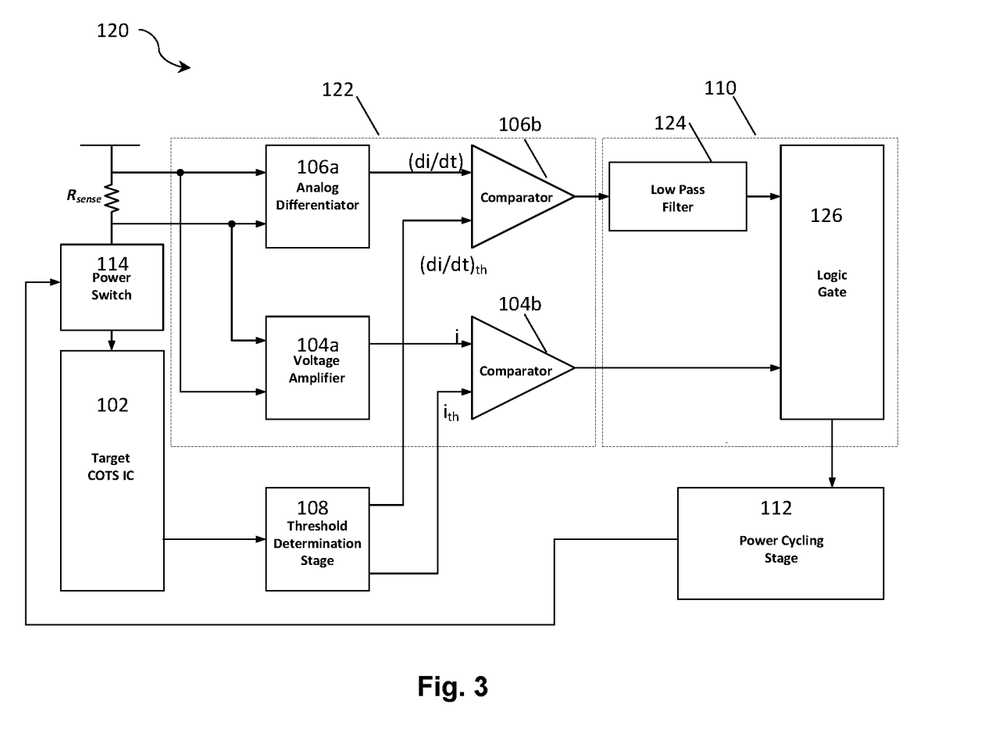
FIG. 3 is a block diagram of an SEL detection and protection circuit in accordance with a second embodiment of the invention.

FIG. 3 shows a more detailed embodiment of an SEL detection and protection circuit 120 in accordance with the present invention. This embodiment is based on the general architecture outlined above in relation to FIG. 2 and so like reference numerals will be employed for like features. As illustrated in FIG. 3, the circuit 120 comprises a detection stage 122 in addition to the determination stage 110.

In FIG. 3, more details of the first and second detectors 104, 106 in the detection stage 122 are shown. In particular, the first detector 104 comprises a voltage amplifier 104a and a first comparator 104b. The voltage amplifier 104a is arranged to sense the load current (i) through a resistor $R_{sense}$. The first comparator 104b then compares the load current (i) with the threshold current ($i_{th}$) provided by the threshold determination unit 108.

The second detector 106 comprises an analog differentiator 106a and a second comparator 106b. The analog differentiator 106a is arranged to detect the rate of change of load current (di/dt) through the resistor $R_{sense}$. The second comparator 106b then compares the rate of change of load current (di/dt) with the threshold current change rate $(di/dt)_{th}$ provided by the threshold determination unit 108.

Output signals from each comparator are input to the determination stage 110 as before. In this embodiment, the output signal from the second comparator 106b is put through a low-pass filter 124 before being received by logic gate 126 so as to remove false trigger signals that may be caused by normal transient current. The output signal from the first comparator 104b is also input to the logic gate 126 which will send a signal to the power cycling stage 112 if either of the absolute load current (i) or rate of change of load current (di/dt) has exceeded the respective threshold values (as determined by each comparator).

Upon receipt of a power shut-down signal from the determination stage 110, the power cycling stage 112 will then disable the power switch 114 to the IC 102 and subsequently resume power to the IC 102 (by reconnecting power switch 114) after a pre-determined duration.

Figure 4:
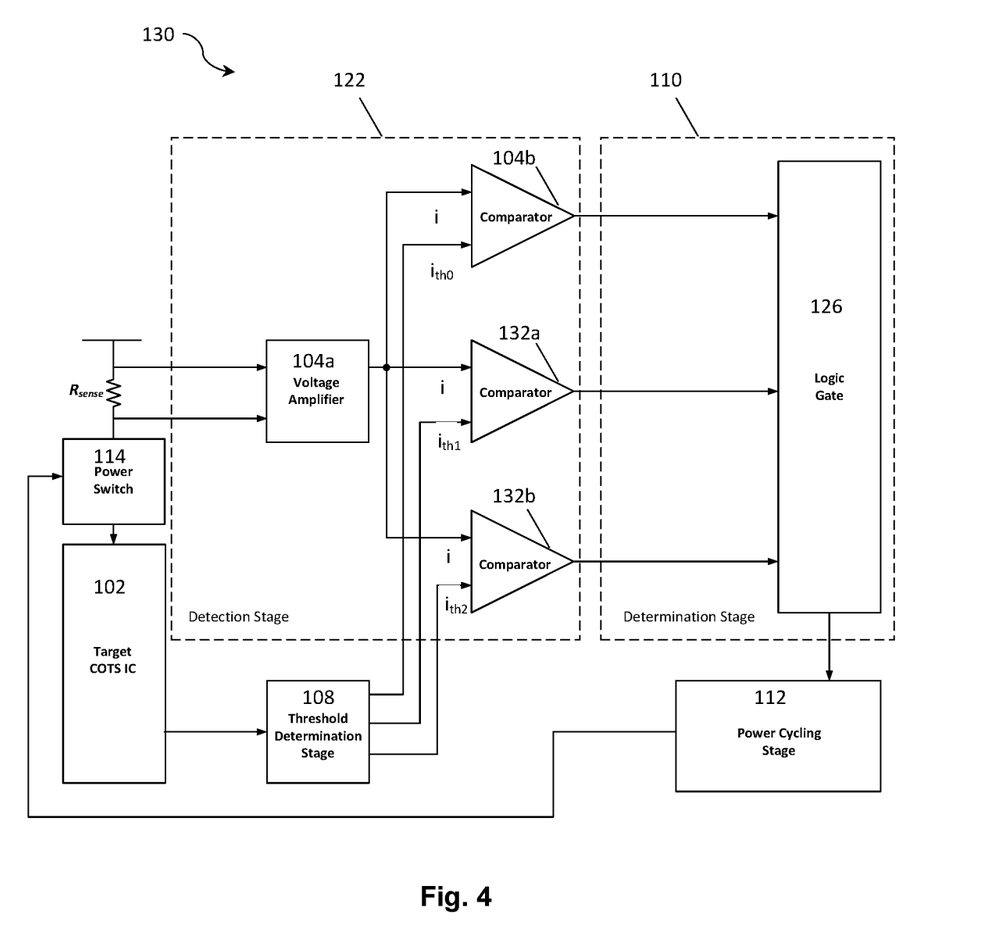
FIG. 4 is a block diagram of an SEL detection and protection circuit in accordance with a third embodiment of the invention.

FIG. 4 shows another detailed embodiment of an SEL detection and protection circuit 130 in accordance with the present invention. This embodiment is also based on the general architecture outlined above in relation to FIG. 2 and has some features in common with the embodiment of FIG. 3 and so like reference numerals will be employed for like features. As illustrated in FIG. 4, the circuit 130 comprises a detection stage 122 and a determination stage 110, similar to FIG. 3.

In the embodiment of FIG. 4, the load current (i) is again sensed through $R_{sense}$ and is obtained at the voltage amplifier 104a. However, in this case the rate of change of load current (di/dt) is not directly obtained but is calculated as explained below.

Similarly to the embodiment of FIG. 3, the obtained load current (i) is compared with an absolute threshold current $i_{th0}$ (which is programmed into the system via the threshold determination unit 108) by a first comparator 104b. However, in this case the threshold current change rate $(di/dt)_{th}$ is not programmed directly into the threshold determination unit 108. Instead, first and second threshold current values $i_{th1}$ and $i_{th2}$ are programmed into the threshold determination unit 108 and each of which are compared to the load current (i) by a comparator 132a and 132b, respectively. Notably, $i_{th0} \gg i_{th2} > i_{th1}$.

The logic gate 126 in the determination stage 110 monitors the output from each of the comparators 104b, 132a and 132b. When the load current (i) is greater than or equal to $i_{th1}$, the determination stage 110 generates a timestamp or starts a clock to measure the time interval (dt) until the load current (i) is greater than or equal to $i_{th2}$. If the measured time (dt) is determined to be equal to or within a pre-determined threshold time interval ($dt_{th}$) it may be determined that a SEL event has occurred and the power shut-down will be triggered.

Thus, knowing the difference between $i_{th1}$ and $i_{th2}$ (di) and the time taken (dt) for the current to increase from $i_{th1}$ to $i_{th2}$ we can determine the current change rate (di/dt) and can compare it to a threshold current change rate $(di/dt)_{th}$.

TABLE 1

Comparison of an embodiment of the invention with the conventional approach

| | Embodiment 2 | Conventional Approach |
| --- | --- | --- |
| Response Time [μs] | 100 | 750 |
| Shutdown Current [mA] | 180 | 400 |

Table 1 tabulates the response time and shut-down current for the second embodiment of the present invention described above in relation to FIG. 3 and the conventional approach, when an SEL event is detected. At 150 mA nominal load current, the embodiment of the invention is able to identify the SEL occurrence and shut down the power supply within 100 μs. This is a significant 7.5 times faster than the conventional approach. Furthermore, the shutdown current (i.e. load current when the SEL detection and protection circuit is triggered) is a low 180 mA (which is equivalent to 1.2 times the nominal current) when using the embodiment of the invention. This is a significant greater than 2 times lower than the conventional approach. Thus, embodiments of the invention can achieve a substantially lower shutdown current and a substantially faster response time than the current state of the art. This translates to substantially-enhanced SEL protection for a target IC, and hence the lifetime of a COTS IC can be expected to be significantly extended, which results in substantially increased reliability and greater suitability for demanding applications such as those encountered in space.

Figure 5:
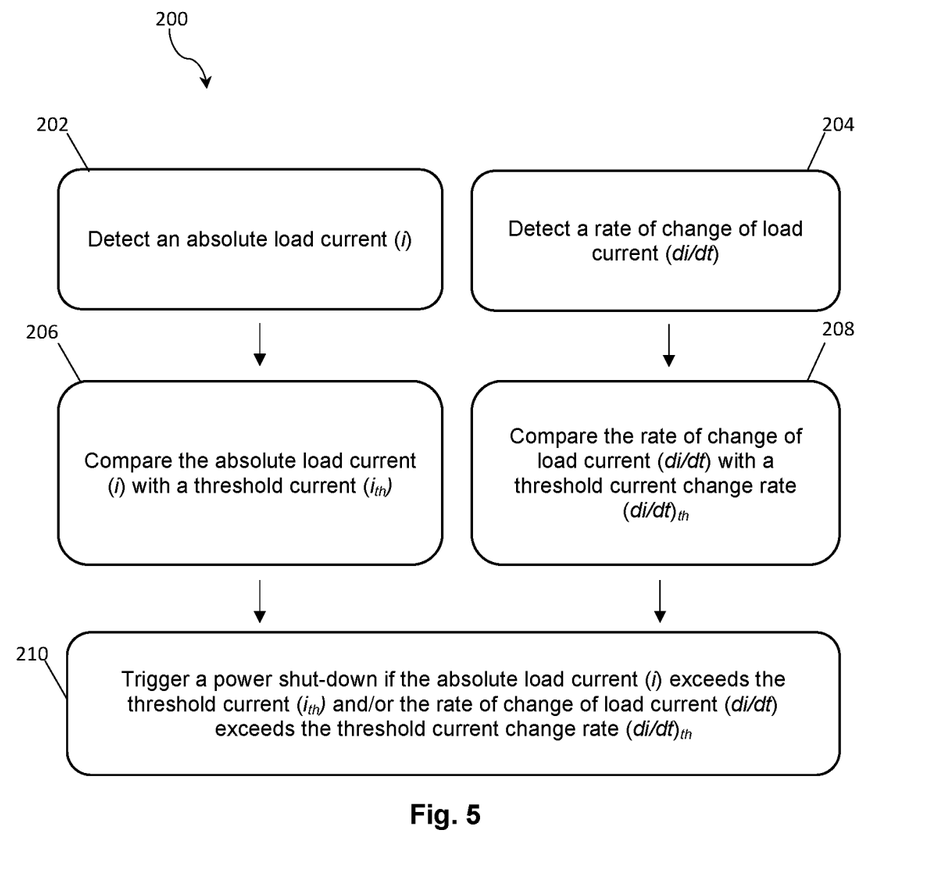
FIG. 5 is a flow diagram illustrating an SEL detection and protection method in accordance with an embodiment of the invention.

FIG. 5 is a flow diagram illustrating an SEL detection and protection method 200 in accordance with an embodiment of the invention. The method 200 comprises the following steps:

Step 202: detecting an absolute load current (i) for a target IC;
Step 204: detecting a rate of change of load current (di/dt) for the target IC;
Step 206: comparing the absolute load current (i) with a threshold current ($i_{th}$);
Step 208: comparing the rate of change of load current (di/dt) with a threshold current change rate $(di/dt)_{th}$; and
Step 210: triggering a power shut-down to the target IC if the absolute load current (i) exceeds the threshold current ($i_{th}$) and/or the rate of change of load current (di/dt) exceeds the threshold current change rate $(di/dt)_{th}$.

The method may be implemented by any of the preceding embodiments.

An advantage of the proposed method is that SEL can be detected using a combination of absolute current detection and current change rate detection so that protection of the target IC can be implemented when either one of these values exceeds its respective threshold value.

Although only certain embodiments of the present invention have been described in detail, many variations are possible in accordance with the appended claims.

The invention claimed is:

1. An electronic circuit for single-event latch-up (SEL) detection and protection of a target integrated circuit (IC) comprising:
   a) a first detector configured for detecting an absolute load current (i) and comparing the absolute load current (i) with a threshold current ($i_{th}$);
   b) a second detector configured for detecting a rate of change of load current (di/dt) and comparing the rate of change of load current (di/dt) with a threshold current change rate $(di/dt)_{th}$;
   c) a threshold determination unit configured for calculating the threshold current ($i_{th}$) and the threshold current change rate $(di/dt)_{th}$ by monitoring an actual load current and an actual rate of change of load current to determine a range indicative of normal circuit behavior and determining the threshold values based on expected maximum values for the normal operating range; and
   d) a determination module for triggering a power shut-down to the target IC if at least one of the following conditions are satisfied: the absolute load current (i) exceeds the threshold current ($i_{th}$); or the rate of change of load current (di/dt) exceeds the threshold current change rate $(di/dt)_{th}$.

2. The electronic circuit according to claim 1 wherein the threshold values are within a range of 1.5 to 2 times, 2 to 3 times, 3 to 4 times or 4 to 5 times the expected maximum values.

3. The electronic circuit according to claim 1 wherein the absolute load current (i) is detected by measuring the voltage (V) across a resistor $R_{sense}$ and dividing V by $R_{sense}$.

4. The electronic circuit according to claim 1 wherein the first detector comprises a first comparator for comparing the absolute load current (i) with the threshold current ($i_{th}$).

5. The electronic circuit according to claim 1 wherein the second detector comprises a second comparator for comparing the rate of change of load current (di/dt) with the threshold current change rate $(di/dt)_{th}$.

6. The electronic circuit according to claim 5 wherein the second comparator comprises a first module for comparing the absolute load current (i) with a first load current value ($i_{th1}$) and a second module for comparing the absolute load current (i) with a second load current value ($i_{th2}$), where $i_{th2} > i_{th1}$ and wherein a time interval (dt) is measured between when the absolute load current (i) exceeds $i_{th1}$ to when the absolute load current (i) exceeds $i_{th2}$ so as to determine the rate of change of load current (di/dt).

7. The electronic circuit according to claim 6 wherein the threshold current change rate $(di/dt)_{th}$ is set such that $di_{th} = i_{th2} - i_{th1}$ and $dt_{th}$=a typical time interval for the load current (i) to increase from $i_{th1}$ to $i_{th2}$ due to a SEL event.

8. The electronic circuit according to claim 6 wherein the threshold current $i_{th}$ is 10, 20, 30, 50 or 100 times greater than $i_{th2}$.

9. The electronic circuit according to claim 1 wherein a filter is employed to filter out false trigger signals caused by normal transient current.

10. The electronic circuit according to claim 1 wherein the determination module comprises one or more logic gates.

11. The electronic circuit according to claim 1 wherein the target integrated circuit (IC) is a Commercial-Off-The-Shelf (COTS) IC.

12. The electronic circuit according to claim 1 wherein the target integrated circuit (IC) is configured for a space application.

13. The electronic circuit according to claim 1 wherein the determination module triggers a power cycling stage to shut-down the target IC and subsequently resume power to the target IC after a pre-determined duration.

14. The electronic circuit according to claim 13 wherein the pre-determined duration is calculated to ensure SEL effects are completely eradicated.

15. An electronic device comprising an electronic circuit for single-event latch-up (SEL) detection and protection in accordance with claim 1 and a target integrated circuit (IC).

16. A method of single-event latch-up (SEL) detection and protection for a target integrated circuit (IC) comprising:
   a) detecting an absolute load current (i);
   b) calculating a threshold current (ith) by monitoring an actual load current to determine a range indicative of normal circuit behavior and determining the threshold current (ith) based on an expected maximum value for the normal operating range;
   c) comparing the absolute load current (i) with the threshold current ($i_{th}$);
   d) detecting a rate of change of load current (di/dt);
   e) calculating a threshold current change rate (di/dt)th by monitoring an actual rate of change of load current to determine a range indicative of normal circuit behavior and determining the threshold current change rate (di/dt)th based on an expected maximum value for the normal operating range;
   f) comparing the rate of change of load current (di/dt) with the threshold current change rate $(di/dt)_{th}$; and
   g) triggering a power shut-down to the target IC if at least one of the following conditions are satisfied: the absolute load current (i) exceeds the threshold current ($i_{th}$)

or the rate of change of load current (di/dt) exceeds the threshold current change rate $(di/dt)_{th}$.

\* \* \* \* \*